(12) United States Patent
Xie et al.

(10) Patent No.: US 8,917,371 B2
(45) Date of Patent: Dec. 23, 2014

(54) LIQUID CRYSTAL DISPLAY COMPRISING TWO PIXEL REGIONS JUXTAPOSED ALONG A SIGNAL LINE AND SEPARATED BY A GAP WHEREIN A PIXEL ELECTRODE IS FORMED IN ONE PIXEL REGION AND A COMMON ELECTRODE IS FORMED IN THE OTHER PIXEL REGION

(71) Applicants: Beijing Boe Optoelectronics Technology Co., Ltd., Beijing (CN); Boe Technology Group Co., Ltd., Beijing (CN)

(72) Inventors: Zhenyu Xie, Beijing (CN); Xiang Liu, Beijing (CN); Xu Chen, Beijing (CN)

(73) Assignees: Beijing Boe Optoelectronics Technology Co., Ltd., Beijing (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/173,315

(22) Filed: Feb. 5, 2014

(65) Prior Publication Data
US 2014/0160389 A1    Jun. 12, 2014

Related U.S. Application Data

(63) Continuation of application No. 12/881,382, filed on Sep. 14, 2010, now Pat. No. 8,670,099.

(30) Foreign Application Priority Data
Sep. 15, 2009   (CN) .......................... 2009 1 0092677

(51) Int. Cl.
*G02F 1/1343*   (2006.01)
*G02F 1/1362*   (2006.01)
*H01L 27/12*    (2006.01)
*G02F 1/1335*   (2006.01)
*G02F 1/1333*   (2006.01)

(52) U.S. Cl.
CPC .... *G02F 1/136277* (2013.01); *G02F 1/134309* (2013.01); *H01L 27/124* (2013.01); *G02F 1/133512* (2013.01); *G02F 1/133514* (2013.01);
(Continued)

(58) Field of Classification Search
USPC .................. 349/113, 114, 139, 142, 143, 158
See application file for complete search history.

(56) References Cited

U.S. PATENT DOCUMENTS

| 2002/0122130 A1 | 9/2002 | Yamaguchi et al. |
| 2003/0146475 A1 | 8/2003 | Lai |

(Continued)

FOREIGN PATENT DOCUMENTS

| CN | 1819217 A | 8/2006 |
| CN | 101236974 A | 8/2008 |

(Continued)

OTHER PUBLICATIONS

USPTO RR dated Aug. 17, 2012; U.S. Appl. No. 12/881,382.
(Continued)

*Primary Examiner* — Paul Lee
(74) *Attorney, Agent, or Firm* — Ladas & Parry LLP

(57) ABSTRACT

A TFT-LCD assembly substrate comprises an array structure layer, comprising a plurality of first signal lines and a plurality of second signal lines. Adjacent first signal lines and adjacent second signal lines cross each other to define a plurality of combination pixel regions, and each of the combination pixel regions comprises two pixel regions juxtaposed along a direction of the first signal line, and there are a thin film transistor and a pixel electrode formed in one pixel region of the two pixel regions and there is a common electrode formed in the other pixel region.

20 Claims, 11 Drawing Sheets

(52) U.S. Cl.
CPC ............... *G02F 1/136209* (2013.01); *G02F 2001/133368* (2013.01); *G02F 2001/13356* (2013.01); *G02F 2001/134318* (2013.01); *G02F 2001/136222* (2013.01); *G02F 2001/136236* (2013.01); *G02F 2201/40* (2013.01)
USPC .......................................... 349/142; 349/143

(56) References Cited

U.S. PATENT DOCUMENTS

| | | |
|---|---|---|
| 2006/0169983 A1 | 8/2006 | Sawamizu et al. |
| 2006/0227273 A1* | 10/2006 | Shin et al. .................. 349/139 |
| 2008/0180355 A1 | 7/2008 | Lee et al. |
| 2009/0167998 A1 | 7/2009 | Park et al. |
| 2009/0174858 A1 | 7/2009 | Tai et al. |

FOREIGN PATENT DOCUMENTS

| | | |
|---|---|---|
| JP | 10-020331 A | 1/1998 |
| KR | 20080026908 A | 3/2008 |

OTHER PUBLICATIONS

USPTO NFOA dated Jan. 15, 2013; U.S. Appl. No. 12/881,382.
USPTO FOA dated Aug. 2, 2013; U.S. Appl. No. 12/881,382.
USPTO NOA dated Oct. 21, 2013; U.S. Appl. No. 12/881,382.

\* cited by examiner

F1 - F1

H1 - H1

LIQUID CRYSTAL DISPLAY COMPRISING TWO PIXEL REGIONS JUXTAPOSED ALONG A SIGNAL LINE AND SEPARATED BY A GAP WHEREIN A PIXEL ELECTRODE IS FORMED IN ONE PIXEL REGION AND A COMMON ELECTRODE IS FORMED IN THE OTHER PIXEL REGION

CROSS-REFERENCE

This application is a continuation of Ser. No. 12/881,382 filed Sep. 14, 2010, the disclosures of which are incorporated herein by reference.

BACKGROUND

Embodiments of the present invention relate to a thin film transistor liquid crystal display (TFT-LCD) assembly substrate, a liquid crystal display and a method of manufacturing the same.

Thin film transistor liquid crystal displays (TFT-LCDs) have the advantages of small volume, low energy consumption, low radiation and the like, and thus have prevailed in the flat plate display market. The main structure of a liquid crystal display comprises an array substrate and a color filter substrate assembled together with a liquid crystal interposed therebetween. The color filter substrate comprises red (R), green (G) and blue (B) color filters in a matrix and a common electrode; and the array substrate comprises gate lines and data lines formed thereon, and the gate lines and the data lines are perpendicular to each other to define pixel regions, and in each pixel region, a thin film transistor (TFT) and a pixel electrode are provided.

With regarding to the liquid crystal display configured as mentioned above, one of the main disadvantages thereof is in that the aperture ratio is relatively small. Because the ratio of the area of the gate line and the data line that account for the entire area of the substrate is relatively large, the width of the gate line and the data line are the important factors that limit the aperture ratio of a TFT-LCD.

SUMMARY

An embodiment of the present invention provides a TFT-LCD assembly substrate, comprising an array structure layer, comprising: a plurality of first signal lines; and a plurality of second signal lines, wherein adjacent first signal lines and adjacent second signal lines cross each other to define a plurality of combination pixel regions, and each of the combination pixel regions comprises two pixel regions juxtaposed along a direction of the first signal line, and there are a thin film transistor and a pixel electrode formed in one pixel region of the two pixel regions and there is a common electrode formed in the other pixel region.

Another embodiment of the present invention further provides a method of manufacturing a TFT-LCD assembly substrate, comprising: Step 1, forming an array structure layer on a substrate, comprising forming a plurality of first signal lines, a plurality of second signal lines and a plurality of thin film transistors, and adjacent first signal lines and adjacent second signal lines cross each other to define a plurality of combination pixel regions, and each of the combination pixel regions comprises two pixel regions juxtaposed along a direction of the first signal line; and Step 2, forming a pixel electrode and a common electrode for each combination pixel region, wherein the pixel electrode is positioned in the same one pixel region as one of the thin film transistors and connected with one of a drain electrode and a source electrode of the thin film transistor, and the common electrode is positioned in the other pixel region.

Still another embodiment of the present invention further provides a liquid crystal display, comprising: a first thin film transistor liquid crystal display (TFT-LCD) assembly substrate and a second TFT-LCD assembly substrate that are assembled together, wherein the first TFT-LCD assembly substrate comprises: an array structure layer, wherein the array structure layer comprises a plurality of first signal lines and a plurality of second signal lines, and adjacent the first signal lines and adjacent the second signal lines cross each other to define a plurality of combination pixel regions, and each of the combination pixel regions comprises two pixel regions juxtaposed along a direction of the first signal line, and there are a thin film transistor and a pixel electrode formed in one pixel region of the two pixel regions and there is a common electrode formed in the other pixel region; and the second TFT-LCD assembly substrate comprises: a color filter structure layer; and an array structure layer, wherein the color filter structure layer comprises a color filter unit, and the array structure layer comprises a plurality of third signal lines and a plurality of fourth signal lines, and adjacent the third signal lines and adjacent the fourth signal line cross each other to define a plurality of combination pixel regions, and each of the combination pixel regions comprises two pixel regions juxtaposed along a direction of the third signal line, and there are a thin film transistor and a pixel electrode formed in one pixel region of the two pixel regions and there is a common electrode formed in the other pixel region; and wherein the first signal lines and the third signal lines, the second signal lines and the fourth signal lines, the first pixel electrodes and the second common electrodes, the first common electrodes and the second pixel electrodes are disposed opposite to each other, respectively.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter, embodiments of the invention will be described in detail with the accompanying drawings.

The main structure of a liquid crystal display according to the embodiments of the present invention comprises a first TFT-LCD assembly substrate and a second TFT-LCD assembly substrate assembled together with a liquid crystal interposed therebetween.

Figure 1:
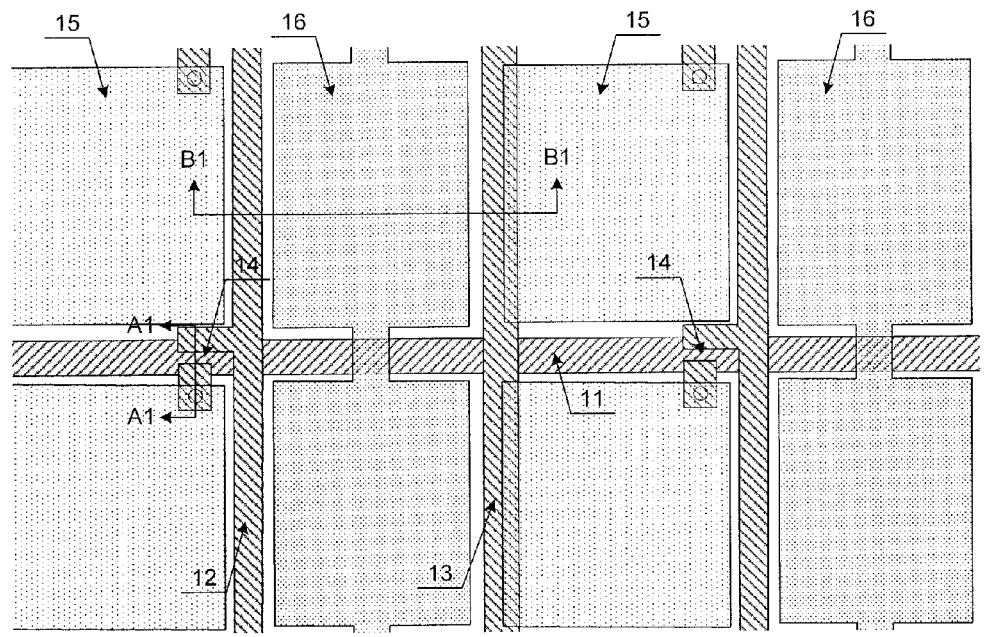
FIG. 1 is a plan view showing a first TFT-LCD assembly substrate in a liquid crystal display according to a first embodiment of the present invention.
Figure 2:
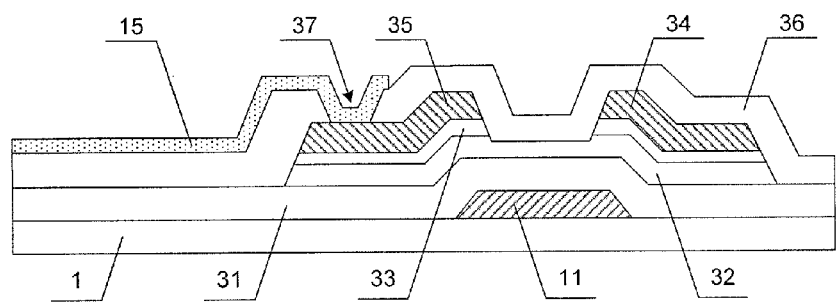
FIG. 2 is a sectional view taken along line A1-A1 in FIG. 1.
Figure 3:
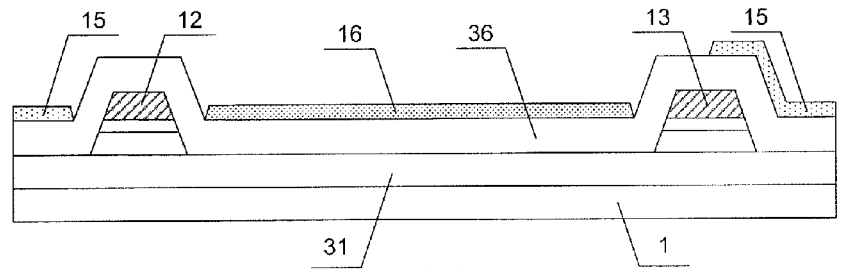
FIG. 3 is a sectional view taken along line B1-B1 in FIG. 1.

FIG. 1 is a plan view showing a first TFT-LCD assembly substrate in a liquid crystal display according to a first embodiment of the present invention, and FIG. 2 is a sectional view taken along line A1-A1 in FIG. 1 and FIG. 3 is a sectional view taken along line B1-B1 in FIG. 1.

As shown in FIGS. 1 to 3, the first TFT-LCD assembly substrate comprises a plurality of first gate lines 11, a plurality of first data lines 12 and a plurality of first shield lines 13, which are all formed on a first substrate 1. The first shield line 13s are parallel to the first data lines 12 and each positioned between two adjacent first data lines 12. Two adjacent first gate lines 11 and two adjacent first data lines 12 cross each other to define combination pixel regions. Each combination pixel region is divided by one first shield line 13 into two pixel regions juxtaposed along a transverse direction: a first pixel region and a second pixel region. There are a first thin film transistor 14 and a first pixel electrode 15 formed as the array structure pattern within the first pixel region, and there is a first common electrode 16 provided within the second pixel region. The first gate line 11 is used to provide a turn-on ("ON") signal for the first thin film transistor 14, and the first data line 12 is used to provide data signals for the first pixel electrode 15, and the first common electrode 16 is used to provide a common voltage signal, and the first shield line 13 functions like a black matrix for shielding a gap between the first pixel electrode 15 and the first common electrode 16. The width of the first shield line 13 may be set to be equal to that of the first data line 12. In the case where the pixel regions are classified into odd columns of pixel regions and even columns of pixel regions, the first pixel region of the first TFT-LCD assembly substrate according to the present embodiment is, for example, located in an odd column and the second pixel region is, for example, located in an even column, that is, the first thin film transistor 14 and the first pixel electrode 15 are formed within an odd column of pixel regions, and the first common electrode 16 is formed within an even column of pixel regions.

Specifically, the first thin film transistor 14 comprises a first gate electrode, a first active layer, a first source electrode 34 and a first drain electrode 35, and a portion of the first gate line 11 is used as the first gate electrode of the first thin film transistor and the first gate line 11 is formed on the first substrate 1; a gate insulating layer 31 is formed on the first gate line 11 to cover the entirety of the first substrate 1, and the first active layer (comprises a semiconductor layer 32 and a doped semiconductor layer 33) is formed on the gate insulating layer 31 and positioned over the portion of the first gate line 11 used as the first gate electrode; the first source electrode 34 and the first drain electrode 35 are formed on the first active layer; one end of the first source electrode 34 is located above the first gate line 11 and the other end thereof is connected with the first data line 12; one end of the first drain electrode 35 is positioned above the first gate line 11 and the other end thereof is connected with the first pixel electrode 15; a first TFT channel region is formed between the first source electrode 34 and the first drain electrode 35, and the doped semiconductor layer 33 in the first TFT channel region is etched away and the semiconductor layer 32 therein is partially etched away in a thickness direction, so that the semiconductor layer 32 of the first TFT channel region is exposed; the first shield line 13 is disposed in the same layer as the first data line 12 and positioned between two adjacent first data lines 12 and divides one combination pixel region into a first pixel region and a second pixel region; a passivation layer 36 is formed on the first data line 12, the first shield line 13, the first source electrode 34 and the first drain electrode 35 to cover the entirety of the first substrate 1, and a first passivation layer via hole 37 is formed in the passivation layer 36 at the position of the first drain electrode 35; the first pixel electrode 15 is formed within the first pixel region, and the first pixel electrode 15 is connected to the first drain electrode 35 through the first passivation layer via hole 37; an edge of the first pixel electrode 15 is superposed on the first shield line 13 so that the first pixel electrode 15 overlaps the first shield line 13 and thus the light leakage at the edge of the first pixel electrode 15 can be prevented, and further the first pixel electrode and the first shield line can constitute storage capacitor; and the first common electrode 16 is formed in the second pixel region adjacent to the first pixel region, and the first common electrodes 16 located in the same column are connected to each other.

Figure 4:
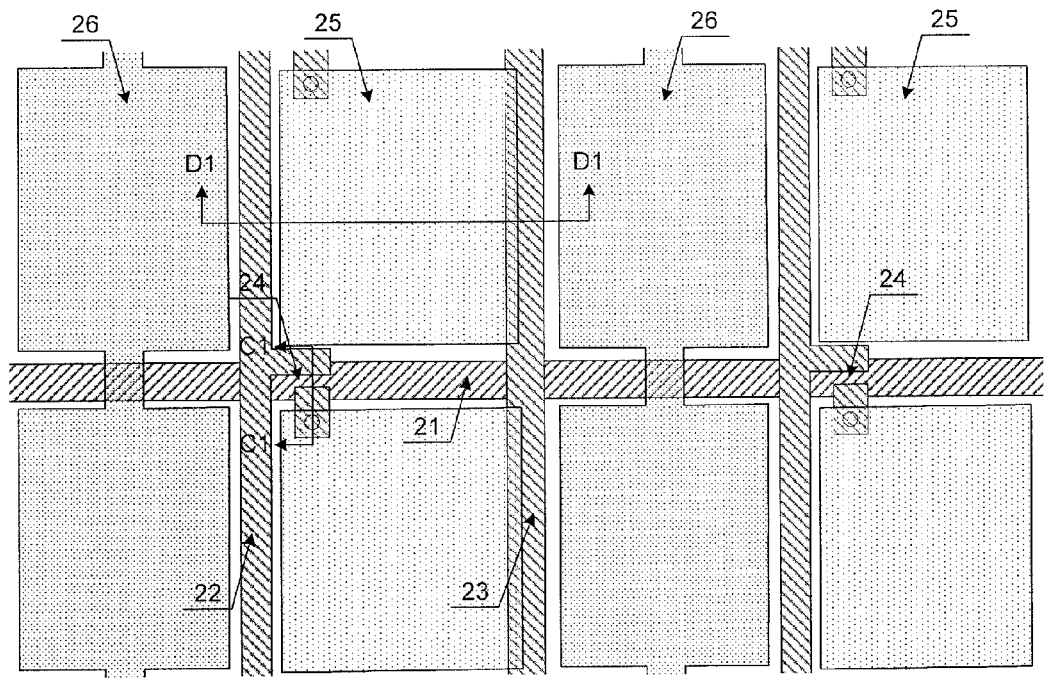
FIG. 4 is a plan view showing a second TFT-LCD assembly substrate in the liquid crystal display according to the first embodiment of the present invention.
Figure 5:
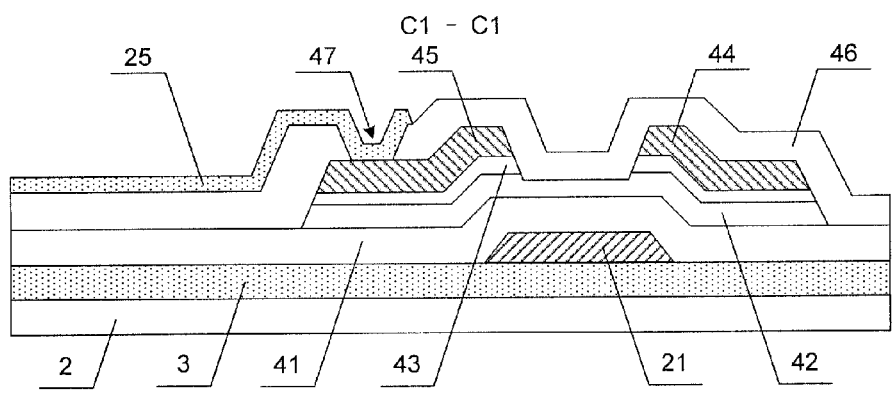
FIG. 5 is a sectional view taken alone line C1-C1 in FIG. 4.

FIG. 4 is a plan view showing a second TFT-LCD assembly substrate in the liquid crystal display according to the first embodiment of the present invention; FIG. 5 is a sectional view taken alone line C1-C1 in FIG. 4; and FIG. 6 is a sectional view taken alone line D1-D1 in FIG. 4.

Figure 6:
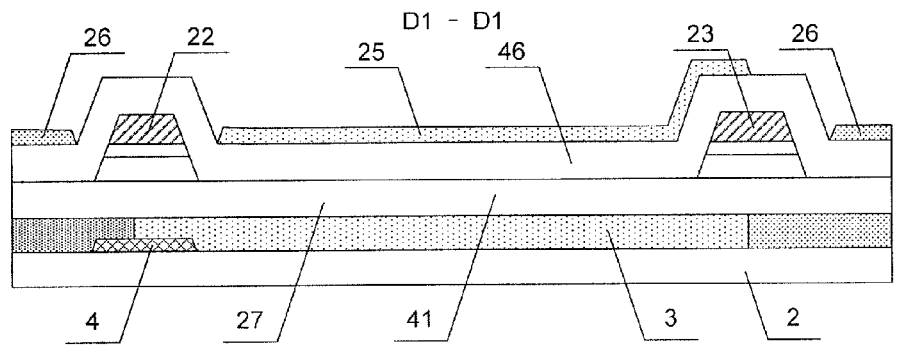
FIG. 6 is a sectional view taken alone line D1-D1 in FIG. 4.

As shown in FIGS. 4 to 6, the main structure of the second TFT-LCD assembly substrate comprises a color filter structure layer and an array structure layer. The color filter structure layer comprises a color filter pattern 3 and a first black matrix 4, which are all formed on a second substrate 2. The color filter pattern 3 comprises red color filter pattern, green color filter pattern and blue color filter pattern in a matrix. The first black matrix 4 is disposed to correspond to a second data line 22, and in particularly, the first black matrix 4 is positioned below the second data line 22. The array structure layer comprises a plurality of second gate lines 21, a plurality of second data lines 22 and a plurality of second shield lines 23, which are all formed on the color filter structure layer. The second shield lines 23 are parallel to the second data lines 22 and each positioned between two adjacent second data lines 22. Two adjacent second gate lines 21 and two adjacent second data lines 22 cross each other to define a plurality of combination pixel regions. Each combination pixel region is divided by one second shield line 23 into two pixel regions juxtaposed along a transverse direction: a third pixel region and a fourth pixel region. There is a second common electrode 26 formed within the third pixel region, and there are a second thin film transistor 24 and a second pixel electrode 25 formed as the array structure pattern within the fourth pixel region. The second gate line 21 is used to provide a turn-on signal for the second thin film transistor 24, the second data line 22 is used to provide data signals for the second pixel electrode 25, the second common electrode 26 is used to provide a common voltage signal, and the second shield line 23 functions like a black matrix for shielding a gap between the second pixel electrode 25 and the second common electrode 26. The width of the second shield line 23 may be set to be equal to that of the second data line 22. In the case where the pixel regions are classified into odd columns of pixel regions and even columns of pixel regions, the third pixel region of the second TFT-LCD assembly substrate according to the present embodiment is, for example, located in an odd column and the fourth pixel region is, for example, located in an even column, that is, the second common electrode 26 is formed within an odd column of pixel regions and the second thin film transistor 24 and the second pixel electrode 25 are formed within an even column of pixel regions.

Specifically, the color filter pattern 3 and the first black matrix 4 are formed on the second substrate 2; the second thin film transistor 24 comprises a second gate electrode, a second active layer, a second source electrode 44 and a second drain electrode 45, and a portion of the second gate line 21 acts as the second gate electrode of the second thin film transistor and the second gate line 21 is formed on the color filter pattern 3; a gate insulating layer 41 is formed on the second gate line 21 to cover the entirety of the second substrate 2, and the second active layer (comprises a semiconductor layer 42 and a doped semiconductor layer 43) is formed on the gate insulating layer 41 and positioned over the portion of the second gate line 21 acting as the second gate electrode; the second source electrode 44 and the second drain electrode 45 are formed on the second active layer; one end of the second source electrode 44 is positioned above the second gate line 21 and the other end thereof is connected with the second data line 22; one end of the second drain electrode 45 is positioned above the second gate line 21 and the other end thereof is connected with the second pixel electrode 25; a second TFT channel region is formed between the second source electrode 44 and the second drain electrode 45, and the doped semiconductor layer 43 of the second TFT channel region is etched away and the semiconductor layer 42 is partially etched away in a thickness direction, so that the semiconductor layer 42 of the second TFT channel region is exposed; the second shield line 23 is disposed in the same layer as the second data line 22 and positioned between two adjacent second data lines 22 and divides one combination pixel region into a third pixel region and a fourth pixel region; a passivation layer 46 is formed on the second data line 22, the second shield line 23, the second source electrode 44 and the second drain electrode 45 to cover the entirety of the second substrate 2, and is provided with a second passivation layer via hole 47 at the position of the second drain electrode 45; the second pixel electrode 25 is formed within the fourth pixel region, and the second pixel electrode 25 is connected with the second drain electrode 45 through the second passivation layer via hole 47; an edge of the second pixel electrode 25 is superposed on the second shield line 23 so that the second pixel electrode 25 overlaps the second shield line 23, and thus, the light leakage at the edge of the second pixel electrode can be prevented, and further the second pixel electrode and the second shield line can constitute storage capacitor; and the second common electrode 26 is formed in the third pixel region adjacent to the fourth pixel region, and the second common electrodes 26 positioned in the same column are connected to each other.

In the liquid crystal display according to the present embodiment, after the first TFT-LCD assembly substrate and the second TFT-LCD assembly substrate are assembled together, the first gate lines 11 on the first TFT-LCD assembly substrate are disposed opposite to the second gate lines 21 on the second TFT-LCD assembly substrate; the first data lines 12 on the first TFT-LCD assembly substrate are disposed opposite to the second data lines 22 on the second TFT-LCD assembly substrate; the first shield lines 13 on the first TFT-LCD assembly substrate are disposed opposite to the second shield lines 23 on the second TFT-LCD assembly substrate; the first pixel regions on the first TFT-LCD assembly substrate correspond to the third pixel regions on the second TFT-LCD assembly substrate, so that the array structure pattern on the first TFT-LCD assembly substrate corresponds to the common electrode pattern on the second TFT-LCD assembly substrate, that is, the first pixel electrodes 15 on the first TFT-LCD assembly substrate are disposed opposite to the second common electrodes 26 on the second TFT-LCD assembly substrate; the second pixel regions on the first TFT-LCD assembly substrate correspond to the fourth pixel regions on the second TFT-LCD assembly substrate, so that the common electrode pattern on the first TFT-LCD assembly substrate correspond to the array structure pattern on the second TFT-LCD assembly substrate, that is, the first common electrodes 16 on the first TFT-LCD assembly substrate is disposed opposite to the second pixel electrodes 25 on the second TFT-LCD assembly substrate.

As can be seen from the above structure, in the liquid crystal display of embodiments of the present invention, by providing both the array structure pattern and the common electrode pattern on each of two TFT-LCD assembly substrates and by assembling together the two TFT-LCD assembly substrates so that the array structure patterns on the two TFT-LCD assembly substrates are not opposite to each other but the array structure pattern on one TFT-LCD assembly substrate corresponds to the common electrode pattern on the other TFT-LCD assembly substrate, forming a liquid crystal display.

Hereinafter, the solution of the present embodiment will be further described with reference to the manufacturing process of the TFT-LCD assembly substrate. In the following description, a patterning process in the embodiment of the present invention can comprise applying of photoresist, exposing and developing of photoresist, etching with a photoresist pattern, and removing remaining photoresist and the like.

Figure 7:
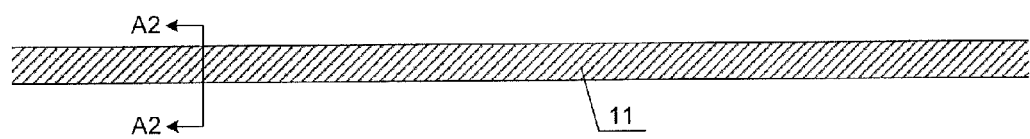
FIG. 7 is a plan view after a first patterning process of the first TFT-LCD assembly substrate in the liquid crystal display according to the first embodiment of the present invention.
Figure 8:
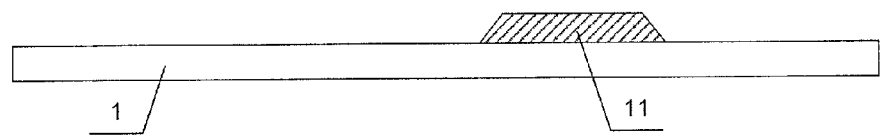
FIG. 8 is a sectional view taken along line A2-A2 in FIG. 7.

FIG. 7 is a plan view after a first patterning process of the first TFT-LCD assembly substrate in the liquid crystal display according to the first embodiment of the present invention, showing the structure of several pixel regions, and FIG. 8 is a sectional view taken along line A2-A2 in FIG. 7. Firstly, a gate metal thin film is deposited on the first substrate (such as a glass substrate or a quartz substrate) 1 by a magnetron sputtering method or a thermal evaporation method, and the gate metal thin film may be a single-layer thin film of Al, Cr, W, Ta, Ti or AlNi or a composite multilayer thin film formed by any combination of the above single-layer thin films. The gate metal thin film is patterned by using a normal mask, and then the first gate lines 1 are formed on the first substrate 1, as shown in FIG. 7 and FIG. 8.

Figure 9:
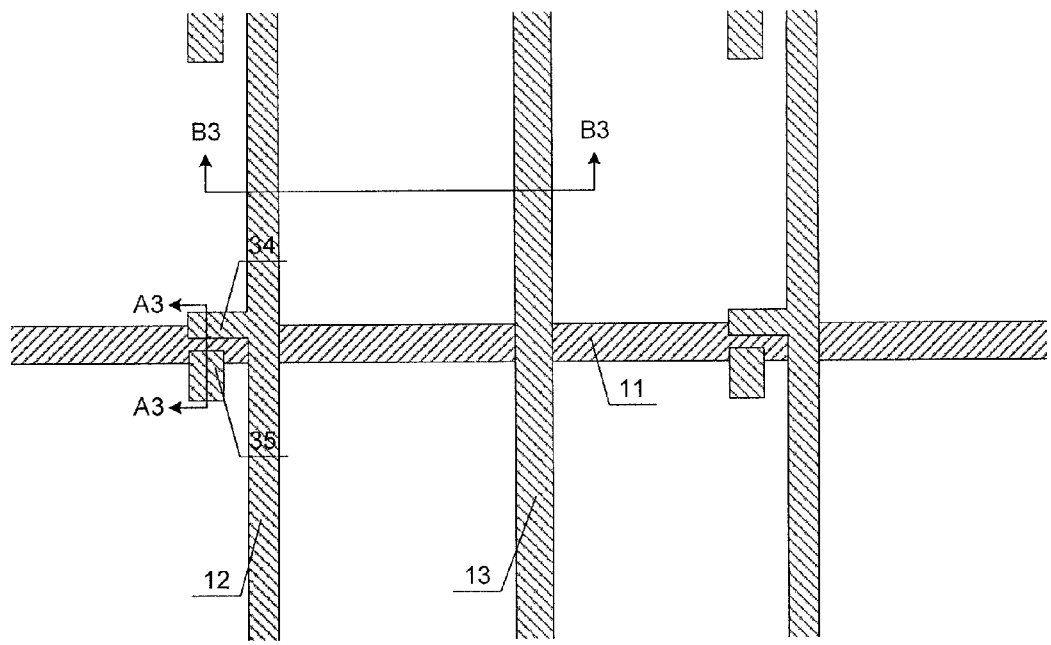
FIG. 9 is a plan view after a second patterning process of the first TFT-LCD assembly substrate in the liquid crystal display according to the first embodiment of the present invention.
Figure 10:
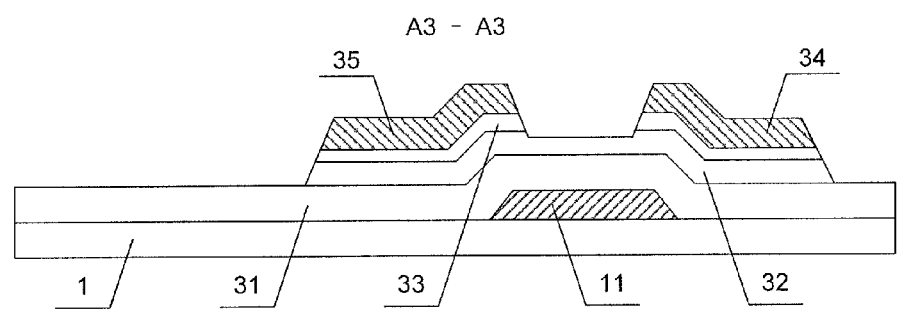
FIG. 10 is a sectional view taken along line A3-A3 in FIG. 9.
Figure 11:
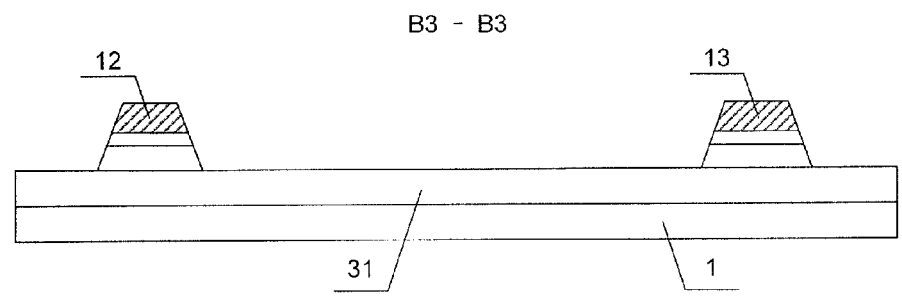
FIG. 11 is a sectional view taken along line B3-B3 in FIG. 9.

FIG. 9 is a plan view after a second patterning process of the first TFT-LCD assembly substrate in the liquid crystal display according to the first embodiment of the present invention, showing the structure of several pixel regions, and FIG. 10 is a sectional view taken along line A3-A3 in FIG. 9, and FIG. 11 is a sectional view taken along line B3-B3 in FIG. 9.

On the substrate with the pattern shown in FIG. 7, a gate insulating layer, a semiconductor thin film, a doped semiconductor thin film and a source/drain metal thin film are firstly deposited, and then, by a patterning process using a half-tone mask or a gray-tone mask, the first active layer, the first data line 12, the first shield line 13, the first source electrode 34, the first drain electrode 35 and the first TFT channel region are formed, as shown in FIG. 9 to FIG. 11.

This patterning process is a multiple-step etching process, comprising the following steps: firstly, the gate insulating layer 31, a semiconductor thin film and a doped semiconductor thin film are sequentially deposited by a plasma enhanced chemical vapor deposition (PECVD) method, and then, a source/drain metal thin film is deposited by a magnetron sputtering method or a thermal evaporation method. A photoresist layer is coated on the source/drain metal thin film, and the photoresist layer is exposed by using a half-tone mask or a gray-tone mask and developed to form a photoresist-completely-retained region, a photoresist-partially-retained region and a photoresist-completely-removed region. The photoresist-completely-retained region corresponds to the region in which the first data line, the first shield line, the first source electrode and the first drain electrode are positioned, and the photoresist-partially-retained region corresponds to the region in which the TFT channel region between the first source electrode and the first drain electrode is positioned, and the photoresist-completely-removed region corresponds to the rest region. After the developing process is performed, the thickness of the photoresist in the photoresist-completely-retained region is not substantially changed, and the thickness of the photoresist in the photoresist-partially-retained region is decreased, and the photoresist in the photoresist-completely-removed region is completely removed. By a first etching process, the source/drain metal thin film, the doped semiconductor thin film and the semiconductor thin film in the photoresist-completely-removed region are etched away to form the first active layer, the first data line 12 and the first shield line 13. By an ashing process, the photoresist in the photoresist-partially-retained region is removed to expose the source/drain metal thin film in this region, and the photoresist in the photoresist-completely-retained region is reduced in thickness. By a second etching process, the source/drain metal thin film and the doped semiconductor thin film in the photoresist-partially-retained region are etched away and the semiconductor thin film in this region is partially etched away to form the first source electrode 34, the first drain electrode 35 and the first TFT channel region. Finally, the remaining photoresist is removed to complete this patterning process.

After the above patterning process, a plurality of combination pixel regions are defined by the intersection of the first gate lines 11 and the first data lines 12, and each combination pixel region is divided by one first shield line 13 into a first pixel region and a second pixel region, and the active layer (comprises the semiconductor layer 32 and the doped semiconductor layer 33) is formed over the portion of the first gate line 11 acting as the first gate electrode, and the first source electrode 34 and the first drain electrode 35 are formed on the doped semiconductor layer 33. One end of the first source electrode 34 is positioned above the first gate line 11 and the other end thereof is connected with the first data line 12, and one end of the first drain electrode 35 is positioned above the first gate line 11 and disposed opposite to the first source electrode 34. The first TFT channel region is formed between the first source electrode 34 and the first drain electrode 35, and the doped semiconductor layer 33 of the first TFT channel region is etched away and the semiconductor layer 32 thereof is partially etched away in a thickness direction, so that the semiconductor layer 32 of the TFT channel region is exposed. Further, the semiconductor thin film and the doped semiconductor thin film are retained below the first data line 12, the first shield line 13, the first source electrode 34 and the first drain electrode 35.

Figure 12:
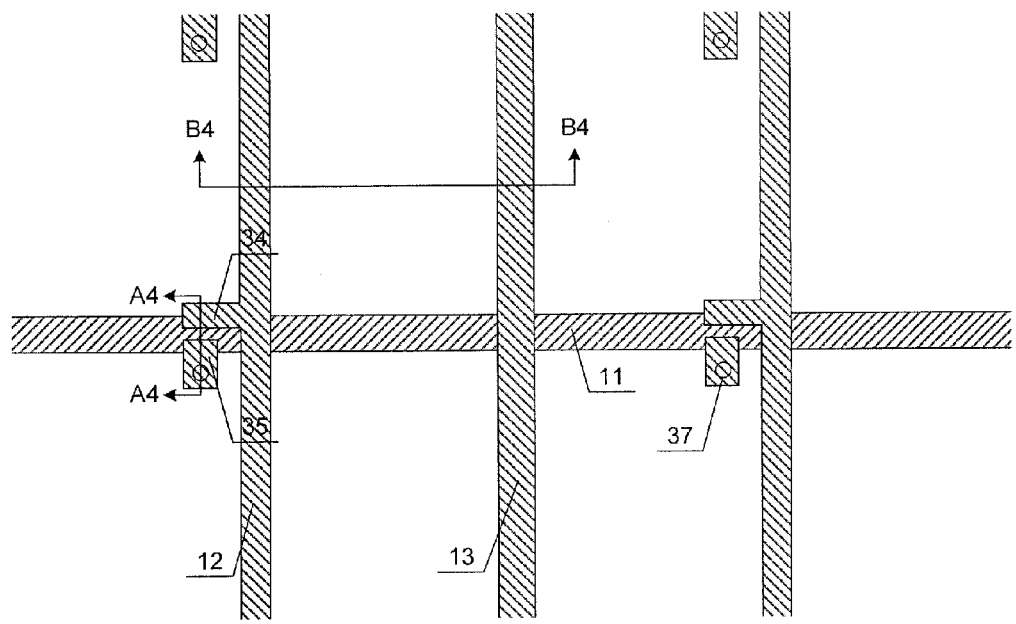
FIG. 12 is a plan view after a third patterning process of the first TFT-LCD assembly substrate in the liquid crystal display according to the first embodiment of the present invention.
Figure 13:
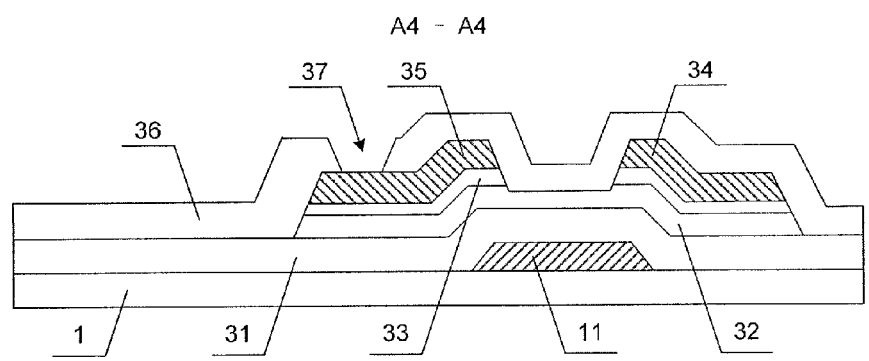
FIG. 13 is a sectional view taken along line A4-A4 in FIG. 12.
Figure 14:
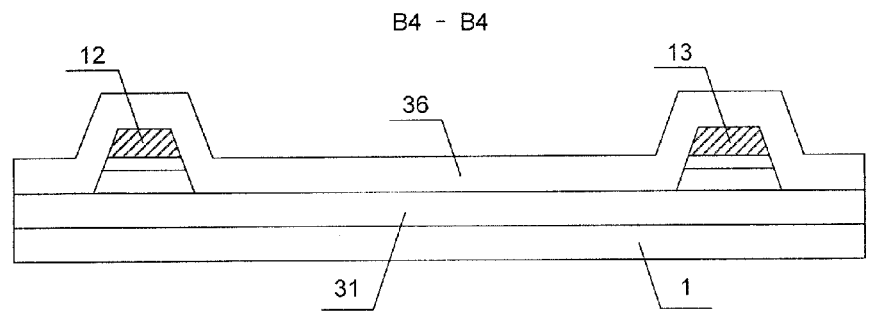
FIG. 14 is a sectional view taken along line B4-B4 in FIG. 12.

FIG. 12 is a plan view after a third patterning process of the first TFT-LCD assembly substrate in the liquid crystal display according to the first embodiment of the present invention, showing the structure of several pixel regions, and FIG. 13 is a sectional view taken along line A4-A4 in FIG. 12 and FIG. 14 is a sectional view taken along line B4-B4 in FIG. 12.

On the substrate with the patterns shown in FIG. 9, a passivation layer 36 is deposited by a PECVD method, and the passivation layer 36 is patterned by using a normal mask, and then a first passivation layer via hole 37 is formed above the first drain electrode 35, as shown in FIGS. 12 to 14. In this patterning process, gate line connecting via holes of a gate line pad region and data line connecting via holes of a data line pad region are simultaneously formed, and the process in which the gate line connecting via holes and the data line connecting via holes are formed by the patterning process have been widely used, so it is omitted.

Finally, on the substrate with the patterns shown in FIG. 12, a transparent conductive thin film is deposited by a magnetron sputtering method or a thermal evaporation method, and the first pixel electrode 15 and the first common electrode 16 are formed by a pattering process using a normal mask. As shown, the first pixel electrode 15 is formed within the first pixel region and connected with the first drain electrode 35 through the first passivation layer via hole 37, while an edge of the first pixel electrode 15 is superposed on the first shield line 13 so that the first pixel electrode 15 overlaps the first shield line 13, and thus, the light leakage can be effectively prevented; further the first pixel electrode and the first shield line constitute storage capacitor, so the first shield line of the present embodiment also acts as a storage electrode. As shown, the first common electrode 16 is formed in the second pixel region adjacent to the first pixel region, and the first common electrodes 16 located in the same column are connected to each other, as shown in FIGS. 1 to 3.

The above mentioned is a method in which the first TFT-LCD assembly substrate is manufactured by the 4-mask process employing a half-tone mask or a gray-tone mask. However, the manufacture of the first TFT-LCD assembly substrate can be completed by a 5-mask process employing a normal mask, in which the above second patterning process employing the half-tone mask or the gray-tone mask is separated into two pattering processes each using a normal mask, that is, the first active layer and the like are formed by one pattering process using a normal mask and the first data line, the first shield line, the first source electrode, the first drain electrode and the first TFT channel region are formed by the other pattering process using a normal mask.

As shown in FIGS. 4 to 6, processes for manufacturing the second TFT-LCD assembly substrate in the liquid crystal display according to the first embodiment of the present invention include the manufacture of the color filter structure layer and the array structure layer. The manufacture of the color filter structure layer includes manufacturing the color filter pattern 3 and the first black matrix 4, and the specific steps comprise the following: firstly, the first black matrix 4 is formed on the second substrate 2, and then, a red color filter material layer is coated on the second substrate 2 formed with the first black matrix 4 and, then, is exposed with a normal mask so that the red color filter material layer is formed into a completely-retained region and a completely-removed region. After the developing process is performed, the red color filter material layer in the completely-removed region is completely removed and the red color filter material layer in the completely-retained region is completely remained, and after the baking process, the red color filter pattern is formed. With the same method, a pattern of blue color filters and a pattern of green color filters are subsequently formed, and the red color filter pattern, the blue color filter pattern and the blue color filter pattern constitute the color filter pattern 3. The formation of the color filter pattern in the three primary colors may be an arbitrary sequence, and the sequence of the formation of the first black matrix 4 and the formation of the color filter pattern 3 may be reversed also. Subsequently, the array structure layer is formed on the color filter structure layer, and the manufacturing process of the array structure layer may be the same as that of the array structure layer in the first TFT-LCD assembly substrate. The color filter structure layer may be disposed at other positions as necessary. For example, the color filter structure layer may be formed above the passivation layer, that is, the color filter structure layer is formed after the formation of the passivation layer, and then, a second passivation layer via hole is formed, and finally, the second pixel electrode and the second common electrode are formed.

The common electrodes are formed on both of the first TFT-LCD assembly substrate and the second TFT-LCD assembly substrate of the present embodiment and the common electrodes on the two assembly substrates may be connected with each other in various manners. For example, the common electrodes on each TFT-LCD assembly substrate may be connected with a connection line provided at in the periphery and then may be further connected to a PCB board through a flexible substrate, so that the common electrodes on the two TFT-LCD assembly substrates can be connected together on the PCB board. Or, for example, the common electrodes on the two TFT-LCD assembly substrates may be connected together by a transparent conductive line disposed at in the periphery, and then, are connected to PCB boards through one or more connection lines. At present, periphery circuits of a liquid crystal display array substrate (having 1024×768 pixel regions for example) are generally configured as the following: 768 gate lines are divided into three regions (there are 256 gate lines in each region) and connected to a timing controller by a flexible PCB board; 3072 data lines (1024×3) are divided into eight regions (there are 384 data lines in each region) and connected to a timing controller by a flexible PCB board. For the present embodiment (1024×768 pixel regions for example), there are 768 gate lines on each of the two TFT-LCD assembly substrates and the 768 gate lines are divided into three regions to connect to a PCB board through a flexible substrate, and there are 1536 data lines (1024×3/2) on each of the two TFT-LCD assembly substrate and the 1536 data lines on each TFT-LCD assembly substrate may be divided into three regions based on odd or even number to connect to a timing controller through a flexible substrate.

The embodiment of the present invention provides a liquid crystal display, which is formed by assembling together two TFT-LCD assembly substrates each formed with both the array structure pattern and the common electrode pattern, and the array structure pattern on one TFT-LCD assembly substrate is not opposite to the array structure pattern on the other TFT-LCD assembly substrate after the assembling process, and the array structure pattern on one TFT-LCD assembly substrate corresponds to the common electrode pattern on the other TFT-LCD assembly substrate. Because the shield lines on one TFT-LCD assembly substrate correspond to the shield lines on the other TFT-LCD assembly substrate, and for the first and second shield lines corresponding to each other, the first shield line can overlap the first pixel electrode on one side of the first shield line, and the second shield line can overlap the second pixel electrode on the other side of the second shield line (that is, the other side of the first shield line), the light leakage on both sides of the shield lines is prevented as a whole, and thus, the aperture ratio of the liquid crystal display is effectively improved.

Figure 15:
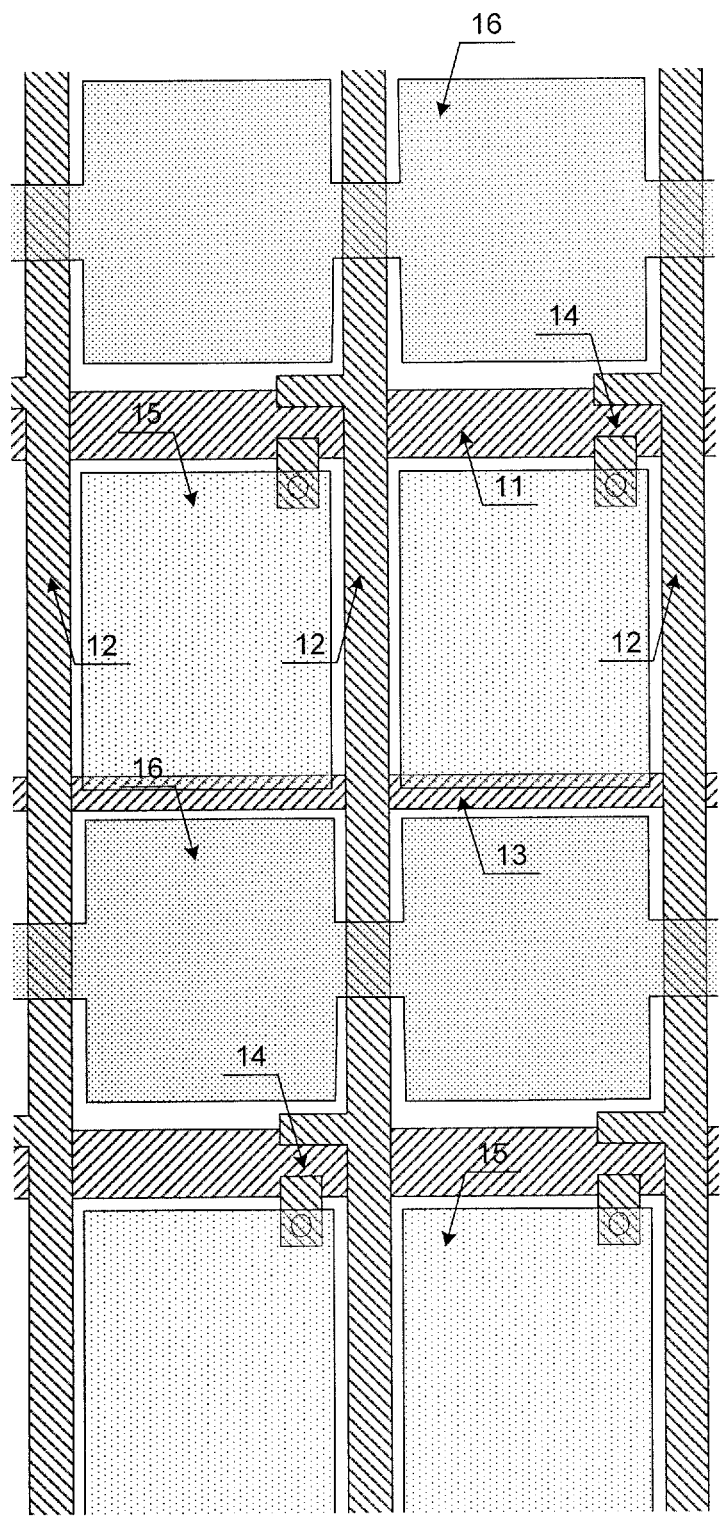
FIG. 15 is a plan view showing a first TFT-LCD assembly substrate in a liquid crystal display according to a second embodiment of the present invention.
Figure 16:
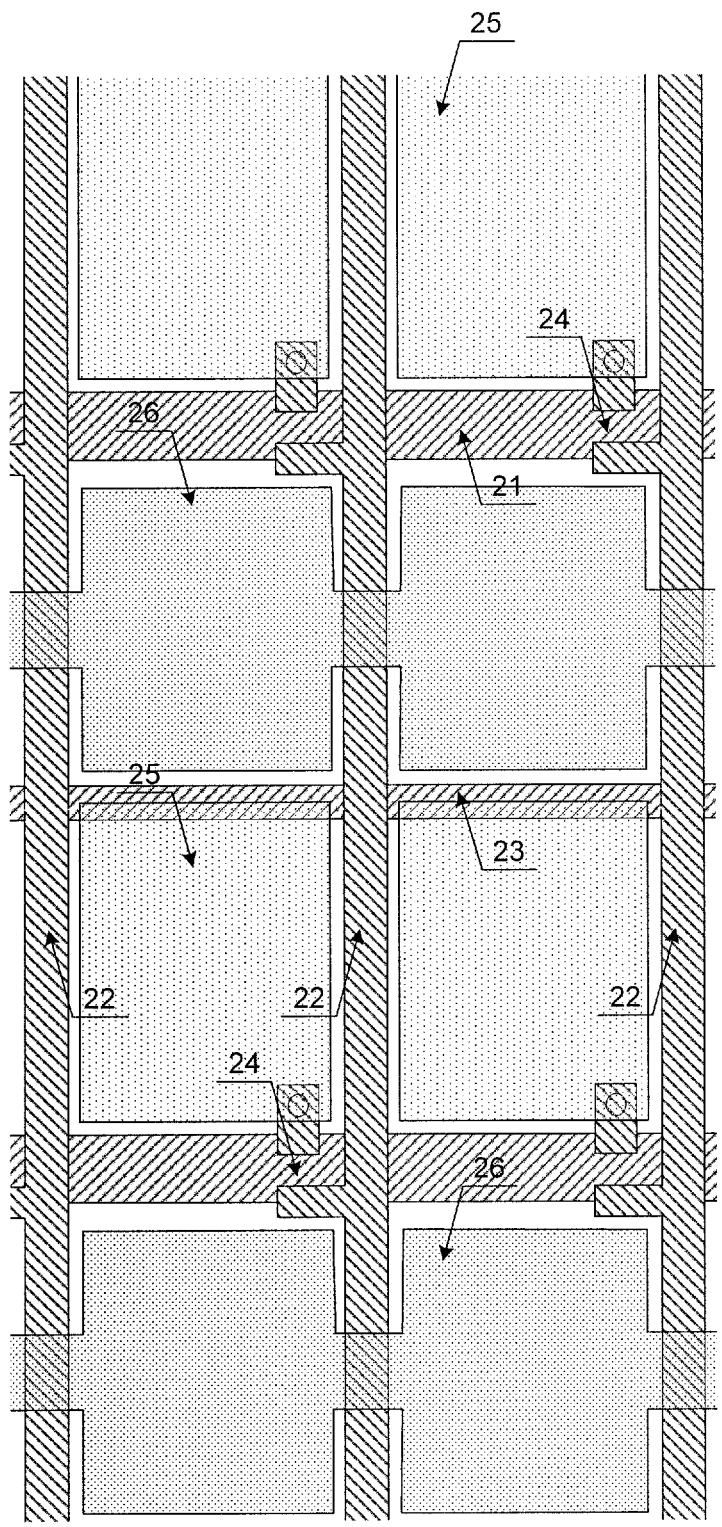
FIG. 16 is a plan view showing a second TFT-LCD assembly substrate in the liquid crystal display according to the second embodiment of the present invention.

FIG. 15 is a plan view showing a first TFT-LCD assembly substrate in a liquid crystal display according to a second embodiment of the present invention, and FIG. 16 is a plan view showing a second TFT-LCD assembly substrate in the liquid crystal display according to the second embodiment of the present invention. As shown in FIGS. 15 and 16, the main structure of the liquid crystal display of the present embodiment comprises the first TFT-LCD assembly substrate and the second TFT-LCD assembly substrate assembled together with a liquid crystal interposed therebetween.

The first TFT-LCD assembly substrate comprises a plurality of first gate lines 11, a plurality of first data lines 12 and a plurality of first shield lines 13, which are all formed on a first substrate. The first shield lines 13 are parallel to the first gate lines 11 and each between two adjacent first gate lines 11. Two adjacent first gate lines 11 and two adjacent first data lines 12 cross each other to define combination pixel regions. Each combination pixel region is divided by one first shield line 13 into a first pixel region and a second pixel region juxtaposed along a longitudinal direction. There are a first thin film transistor 14 and a first pixel electrode 15 formed as the array structure pattern within the first pixel region, and there is a first common electrode 16 provided within the second pixel region. The first common electrodes 16 located in the same row are connected to each other. The first shield lines 13 functions as a black matrix. In the case where the pixel regions are defined into odd rows of pixel regions and even rows of pixel regions, the first pixel regions of the first TFT-LCD assembly substrate according to the present embodiment is, for example, located in an even row and the second pixel region is, for example, located in an odd row, that is, the first thin film transistors 14 and the first pixel electrodes 15 are formed within an even row of pixel regions, and the first common electrodes 16 are formed within an odd column of pixel regions.

The main structure of the second TFT-LCD assembly substrate comprises a color filter structure layer and an array structure layer. The color filter structure layer comprises a color filter pattern and a first black matrix 4, which are all formed on a second substrate. The color filter pattern comprise a red color filter pattern, a green color filter pattern and a blue color filter pattern in a matrix, and the first black matrix 4 is disposed to correspond to the second data line 22, and in particularly, the first black matrix 4 is positioned below the second data line 22. The array structure layer comprises a plurality of second gate lines 21, a plurality of second data lines 22 and a plurality of second shield lines 23, which are all formed on the color filter structure layer. The second shield lines 23 are parallel to the second gate lines 21 and each positioned between two adjacent second gate lines 21. Two adjacent second gate lines 21 and two adjacent second data lines 22 cross each other to define combination pixel regions. Each combination pixel region is divided by one second shield line 23 into a third pixel region and a fourth pixel region juxtaposed along a longitudinal direction. A second common electrode 26 is provided within the third pixel region, and the second common electrodes 26 located in the same row are connected to each other. A second thin film transistor 24 and a second pixel electrode 25 are formed as the array structure pattern within the fourth pixel region and the second shield line 23 functions as a black matrix. In the case where the pixel regions are defined into odd rows of pixel regions and even rows of pixel regions, the third pixel region of the second TFT-LCD assembly substrate according to the present embodiment is, for example, located in an even row and the fourth pixel region is, for example, located in an odd row, that is, the second common electrodes 26 is formed within an even column of pixel regions, and the second thin film transistors 24 and the second pixel electrodes 25 are formed within an odd row of pixel regions.

The structures of the first thin film transistor, the first pixel electrode, the first common electrode, the second thin film transistor, the second pixel electrode and the second common electrode of the present embodiment are the same as those of the first embodiment mentioned above, and block strips may be further disposed on one side or both sides of the first gate line, the first data line, the second gate line and the second data line.

In the liquid crystal display of the present embodiment, the structure after the assembling process of the first TFT-LCD assembly substrate and the second TFT-LCD assembly substrate is the same as that of the previous first embodiment, that is, the gate lines, the data lines and the shield lines on the two TFT-LCD assembly substrates are disposed opposite to each other, respectively; the array structure pattern on one TFT-LCD assembly substrate corresponds to the common electrode pattern on the other TFT-LCD assembly substrate.

As can be seen from the above mentioned structure, in the liquid crystal display of the present invention, by disposing both the array structure pattern and the common electrode pattern on each of two TFT-LCD assembly substrates and by assembling the two TFT-LCD assembly substrates so that the array structure patterns on the two TFT-LCD assembly substrates are not disposed opposite to each other, but the array structure pattern on one TFT-LCD assembly substrate corresponds to the common electrode pattern on the other TFT-LCD assembly substrate. Thus, the aperture ratio of the liquid crystal display is effectively improved. Likewise, by taking 1024×768 pixel regions as a example, there are 768 gate lines formed on the conventional array substrate, and the width of one gate line is usually 10~11 micrometer and the width of one data line is 5.5~6 micrometer. Since the number of the gate lines on each TFT-LCD assembly substrate is reduced by half, the gate lines on the two TFT-LCD assembly substrates are disposed opposite to each other and only one shield line with a width of 5.5~6 micrometer is disposed between two adjacent gate lines, the effective width of the gate line is decreased and the aperture ratio of the liquid crystal display is increased by about 20%.

Figure 17:
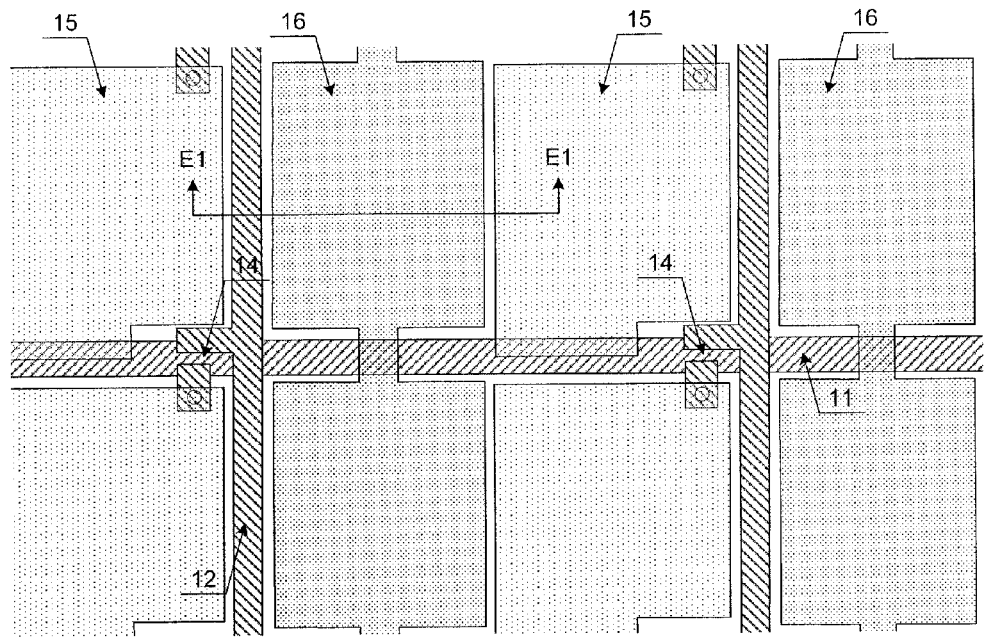
FIG. 17 is a plan view showing a first TFT-LCD assembly substrate in a liquid crystal display according to a third embodiment of the present invention.
Figure 18:
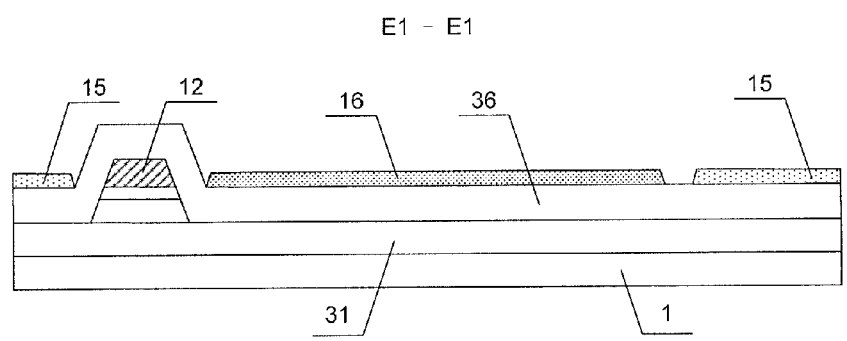
FIG. 18 is a sectional view taken along line E1-E1 in FIG. 17.
Figure 19:
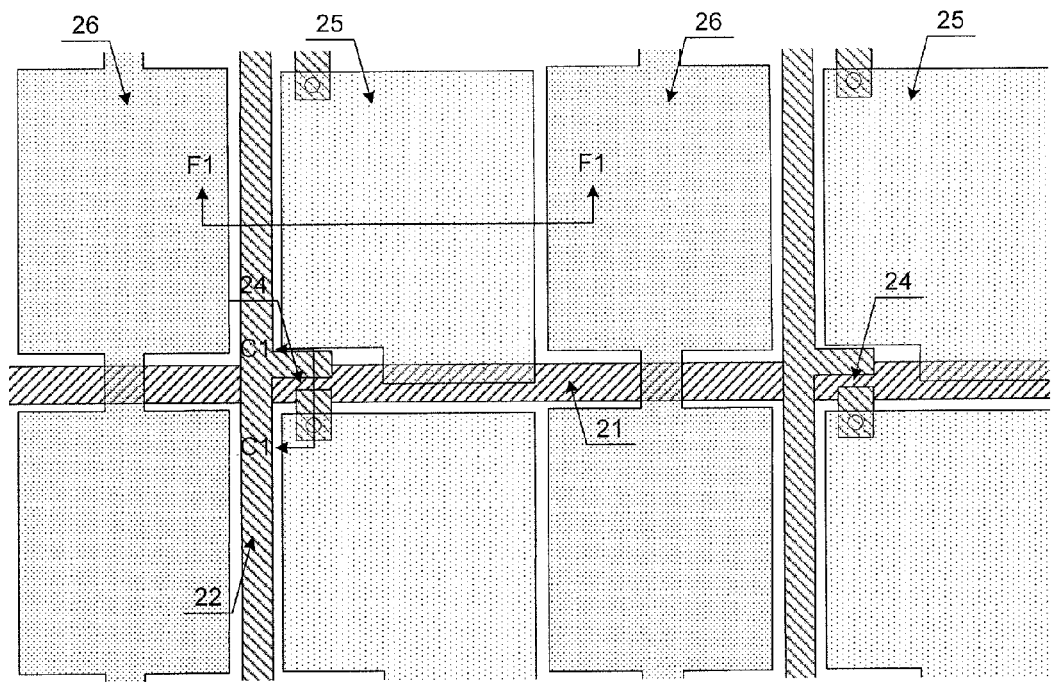
FIG. 19 is a plan view showing a second TFT-LCD assembly substrate in the liquid crystal display according to the third embodiment of the present invention.
Figure 20:
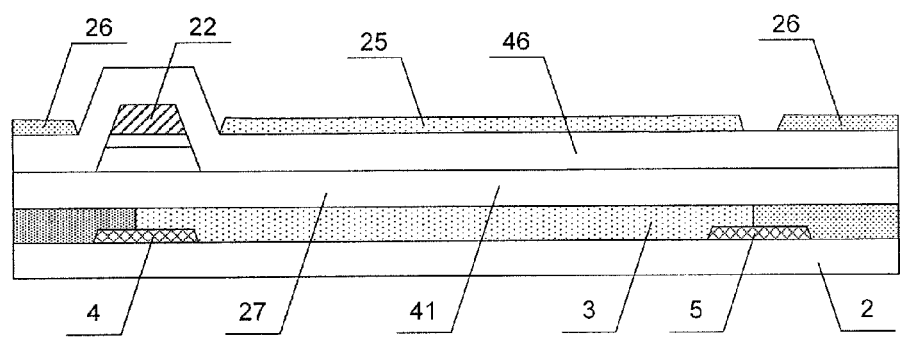
FIG. 20 is a sectional view taken along line F1-F1 in FIG. 19.

FIG. 17 is a plan view showing a first TFT-LCD assembly substrate in a liquid crystal display according to a third embodiment of the present invention, and FIG. 18 is a sectional view taken along line E1-E1 in FIG. 17; FIG. 19 is a plan view showing a second TFT-LCD assembly substrate in the liquid crystal display according to the third embodiment of the present invention, and FIG. 20 is a sectional view taken along line F1-F1 in FIG. 19.

The present embodiment is a modification of the structure of the previous first embodiment, in which the shield line of the first embodiment is displaced by a second black matrix disposed on the second TFT-LCD assembly substrate. The main structure of the first TFT-LCD assembly substrate is substantially the same as that of the first TFT-LCD assembly substrate of the previous first embodiment, and the difference lies in that, in the present embodiment, a first pixel electrode 15 in a first pixel region is spaced apart from a first common electrode 16 in a second pixel region with a predetermined interval, that is, there is not one first shield line disposed between the first pixel region and the second pixel region. Further, the first pixel electrode 15 and the first gate line 11 may constitute storage capacitor. The main structure of the second TFT-LCD assembly substrate is substantially the same as that of the second TFT-LCD assembly substrate of the previous first embodiment, and the difference lies in that, in the present embodiment, a second pixel electrode 25 in a fourth pixel region is spaced apart from a second common electrode 26 in a third pixel region with a predetermined interval, that is, there is a second black matrix 5 but not a second shield line disposed between the three pixel region and the fourth pixel region. Specifically, the second black matrix 5 is disposed between two adjacent second data lines, that is, the second black matrix 5 is disposed between the third pixel region and the fourth pixel region in the combination pixel region to shield a gap between the second pixel electrode 25 and second common electrode 26 (between the first pixel electrode 15 and the first common electrode 16) in the combination pixel region, and the second pixel electrode 25 and the first gate line 21 may constitute storage capacitor.

Figure 21:
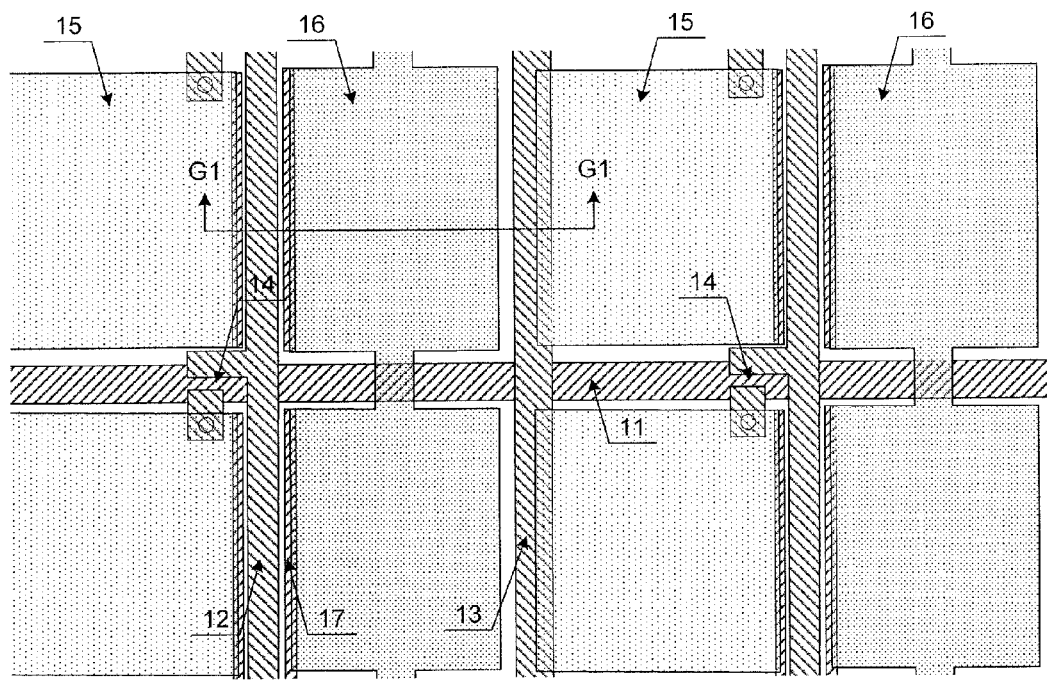
FIG. 21 is a plan view showing a first TFT-LCD assembly substrate in a liquid crystal display according to a fourth embodiment of the present invention.
Figure 22:
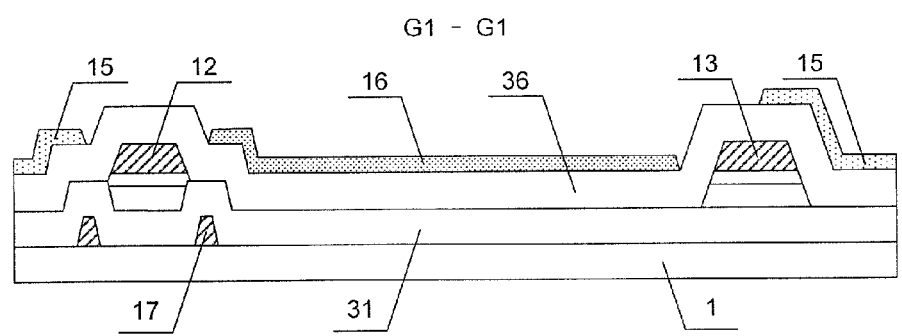
FIG. 22 is a sectional view taken along line G1-G1 in FIG. 21.
Figure 23:
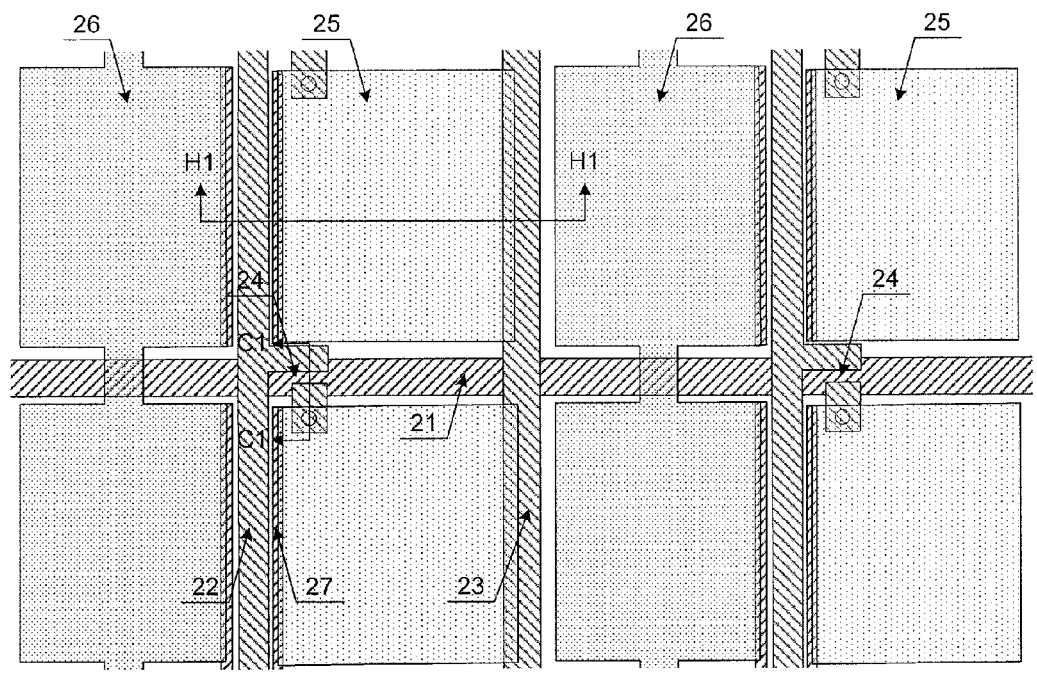
FIG. 23 is a plan view showing a second TFT-LCD assembly substrate in the liquid crystal display according to the fourth embodiment of the present invention.
Figure 24:
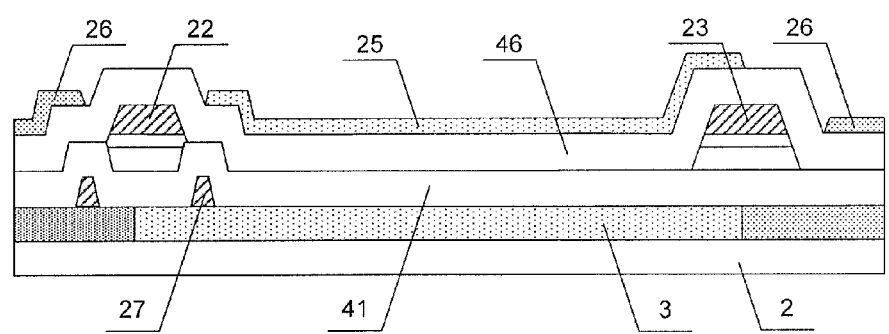
FIG. 24 is a sectional view taken along line H1-H1 in FIG. 23.

FIG. 21 is a plan view showing a first TFT-LCD assembly substrate in a liquid crystal display according to a fourth embodiment of the present invention, and FIG. 22 is a sectional view taken along line G1-G1 in FIG. 21; FIG. 23 is a plan view showing a second TFT-LCD assembly substrate in the liquid crystal display according to the fourth embodiment of the present invention, and FIG. 24 is a sectional view taken along line H1-H1 in FIG. 23.

The present embodiment provided with block strips is a modification of the structure of the previous first embodiment. The main structure of the first TFT-LCD assembly substrate is substantially the same as that of the first TFT-LCD assembly substrate of the previous first embodiment, and the difference lies in that a first block strip 17 is disposed on each side of the first data line 12 of the present embodiment, and the first block strip 17 is used to shield a gap between the first data line 12 and the first pixel electrode 15 or between the first data line 12 and the first common electrode 16 in order to prevent light leakage. The first block strip 17 and the first gate line 11 may be disposed in the same layer in a same patterning process.

The main structure of the second TFT-LCD assembly substrate is substantially the same as that of the second TFT-LCD assembly substrate of the previous first embodiment, and the difference lies in that in the present embodiment, a second block strip 27 is disposed for a second data line 22 of the present embodiment, and the second block strip 27 is used to shield a gap between the second data line 22 and the second pixel electrode 25 or between the second data line 22 and the second common electrode 26 in order to prevent light leakage. The second block strip 27 and the second gate line 21 may be disposed in the same layer in a same patterning process.

In the present embodiment, the aperture ratio can be further increased. By taking 1024×768 pixel regions as a example, there are totally 3072 gate lines formed on the conventional array substrate, and the width of one data line is usually 5.5~6 micrometer, the width of one block strip on each side of the data line is 3~4 micrometer, and a distance between the data line and the block strip is 2~3 micrometer, and thus, the effective width of one data line is up to 15~20 micrometer. Since the number of the data line on each TFT-LCD assembly substrate of the present embodiment is reduced by half, and the data lines on the two TFT-LCD assembly substrates are disposed opposite to each other and one shield line with a width of 5.5~6 micrometer are disposed between two adjacent data lines, the effective width of the data line is decreased and the aperture ratio of the liquid crystal display is increased by about 30%.

It should be noted that, a new solution may be formed by combing the previous embodiments, for example, the shield line and the second black matrix may be simultaneously provided.

The TFT-LCD assembly substrate according to the embodiments of the present invention may be manufacturing by the following method. The method may comprise the following steps.

Step 1, forming gate lines, data lines and thin film transistors on a substrate, wherein a combination pixel region defined by one gate line and one data line comprises two juxtaposed pixel regions;

Step 2, forming a pixel electrode and a common electrode for each combination pixel region, wherein the pixel electrode is positioned in one pixel region and connected with a drain electrode of the thin film transistor and the common electrode is positioned in the other pixel region.

A first example of the method of manufacturing the TFT-LCD assembly substrate according to the embodiments of the present invention may comprise the following steps:

Step 11, depositing a gate metal thin film on a substrate and forming gate lines by a patterning process;

Step 12, depositing a gate insulating layer, a semiconductor thin film, a doped semiconductor thin film and a source/drain metal thin film on the substrate after step 11, and forming data lines, shield lines and an active layer, a source electrode, a drain electrode and a TFT channel region for each TFT by a patterning process, wherein one shield line is positioned between two adjacent data lines and divides the combination pixel region defined by one gate line and one data line into two pixel regions juxtaposed in a transverse direction;

Step 13, depositing a passivation layer on the substrate after step 12, and forming passivation layer via holes by a patterning process, each of which is positioned above the drain electrode of each TFT;

Step 14, depositing a transparent conductive film on the substrate after step 13, and forming a pixel electrode and a common electrode for each combination pixel region by a patterning process, wherein the pixel electrode is positioned in one pixel region and connected with the drain electrode through the passivation layer via hole, and the common electrode is positioned in the other pixel region, and wherein the common electrodes in the same column are connected to each other.

The present example provides the method of manufacturing the TFT-LCD assembly substrate, and the number of the data lines on each substrate is reduced by half by forming both the array structure pattern and the common electrode pattern on the substrate, and thus, the aperture ratio of the liquid crystal display can be effectively improved. The manufacturing method of the present example may be adopted to manufacture the first TFT-LCD assembly substrate in the liquid crystal display according to the first embodiment of the present invention, and the manufacturing process thereof has been in detail described with reference to FIGS. 7 to 14. It should be noted that the second patterning process (step 12) of the present example may be performed not only by 1-mask process with a half-tone mask or a gray-tone mask but also by 2-mask process with normal masks. In addition, in step 11 of the present example, a block strip may be further formed.

A second example of the method of manufacturing the TFT-LCD assembly substrate according to the embodiments of the present invention may comprise the following steps:

Step 21, depositing a gate metal thin film on a substrate and forming gate lines and shield lines by a patterning process, wherein one shield line is positioned between two adjacent gate lines;

Step 22, depositing a gate insulating layer, a semiconductor thin film, a doped semiconductor thin film and a source/drain metal thin film on the substrate after step 21, and forming data lines and an active layer, a source electrode, a drain electrode and a TFT channel region of each TFT by a patterning process, wherein one shield line divides a combination pixel region defined by one gate line and one data line into two pixel regions juxtaposed in a longitudinal direction;

Step 23, depositing a passivation layer on the substrate after step 22, and forming passivation layer via holes by a patterning process, each of which is positioned above the drain electrode of each TFT;

Step 24, depositing a transparent conductive film on the substrate after step 23, and forming a pixel electrode and a common electrode for each combination pixel region by a patterning process, wherein the pixel electrode is positioned in one pixel region and connected with the drain electrode through the passivation layer via hole, and wherein the common electrode is positioned in the other pixel region and the common electrodes in the same row are connected to each other.

The present example provides the method of manufacturing the TFT-LCD assembly substrate, and the number of the gate lines on each substrate is reduced by half by forming both the array structure pattern and the common electrode pattern on the substrate, and thus, the aperture ratio of the liquid crystal display can be effectively improved. The manufacturing method of the present example may be adopted to manufacture the first TFT-LCD assembly substrate in the liquid crystal display according to the second embodiment of the present invention, and the manufacturing process thereof can be performed as described in the first example.

A third example of the method of manufacturing the TFT-LCD assembly substrate according to the embodiments of the present invention may comprise the following steps:

Step 31, forming a color filter structure layer comprising a color filter pattern and a first black matrix on a substrate;

Step 32, depositing a gate metal thin film on the substrate after step 31, and forming gate lines by a patterning process;

Step 33, depositing a gate insulating layer, a semiconductor thin film, a doped semiconductor thin film and a source/drain metal thin film on the substrate after step 32, and forming data lines, shield lines and an active layer, a source electrode, a drain electrode and a TFT channel region of each TFT by a patterning process, wherein one shield line is positioned between two adjacent data lines and divides a combination pixel region defined by one gate line and one data line into two pixel regions juxtaposed in a transverse direction;

Step 34, depositing a passivation layer on the substrate after step 33, and forming passivation layer via holes by a patterning process, each of which is positioned above the drain electrode of each TFT;

Step 35, depositing a transparent conductive film on the substrate after step 34, and forming a pixel electrode and a common electrode for each combination pixel region by a patterning process, wherein the pixel electrode is positioned in one pixel region and connected with the drain electrode through the passivation layer via hole, and wherein the common electrode is positioned in the other pixel region and the common electrodes in the same column are connected to each other.

The present example is a modification of a solution of the previous first example of the method of manufacturing the TFT-LCD assembly substrate, and the difference lies in that the color filter structure layer is further formed. The present example may be adopted to manufacture the second TFT-LCD assembly substrate in the liquid crystal display according to the first embodiment of the present invention. It should be noted that the color filter structure layer may be disposed at other position as necessary, for example, the color filter structure layer may be formed above the passivation layer.

A fourth example of the method of manufacturing the TFT-LCD assembly substrate according to the embodiments of the present invention may comprise the following steps:

Step 41, forming a color filter structure layer comprising a color filter pattern and a first black matrix on a substrate;

Step 42, depositing a gate metal thin film on the substrate after step 41, and forming gate lines and shield lines by a patterning process, wherein one shield line is positioned between two adjacent gate lines;

Step 43, depositing a gate insulating layer, a semiconductor thin film, a doped semiconductor thin film and a source/drain metal thin film on the substrate after the step 42, and forming data lines and an active layer, a source electrode, a drain electrode and a TFT channel region of each TFT by a patterning process, wherein one shield line divides a combination pixel region defined by one gate line and one data line into two pixel regions juxtaposed in a longitudinal direction;

Step 44, depositing a passivation layer on the substrate after step 43, and forming passivation layer via holes by a patterning process, each of which is positioned above the drain electrode of each TFT;

Step 45, depositing a transparent conductive film on the substrate after step 44, and forming a pixel electrode and a common electrode for each combination pixel region by a patterning process, wherein the pixel electrode is positioned in one pixel region and connected with the drain electrode through the passivation layer via hole, and wherein the common electrode is positioned in the other pixel region and the common electrodes in the same row are connected to each other.

The present example is a modification of a solution of the previous second example of the method of manufacturing the TFT-LCD assembly substrate according to the embodiments of the present invention, and the difference lies in that the color filter structure layer is further formed. The present example may be adopted to manufacture the second TFT-LCD assembly substrate in the liquid crystal display according to the second embodiment of the present invention. Likewise, the color filter structure layer may be disposed at other position as necessary, for example, the color filter structure layer may be formed above the passivation layer.

A fifth example of the method of manufacturing the TFT-LCD assembly substrate according to the embodiments of the present invention may comprise the following steps:

Step 51, depositing a gate metal thin film on the substrate and forming gate lines by a patterning process;

Step 52, depositing a gate insulating layer, a semiconductor thin film, a doped semiconductor thin film and a source/drain metal thin film on the substrate after the step 51, and forming data lines and an active layer, a source electrode, a drain electrode and a TFT channel region of each TFT by a patterning process, wherein a combination pixel region defined by one gate line and one data line comprises two juxtaposed pixel regions;

Step 53, depositing a passivation layer on the substrate after step 52, and forming passivation layer via holes by a patterning process, each of which is positioned above the drain electrode of each TFT;

Step 54, depositing a transparent conductive film on the substrate after step 53, and forming a pixel electrode and a common electrode for each combination pixel region by a patterning process, wherein the pixel electrode is positioned in one pixel region and connected with the drain electrode through the passivation layer via hole, and wherein the common electrode is positioned in the other pixel region and the common electrodes in the same column or the same row are connected to each other.

The present example is a modification of the previous first example and second example and may be adopted to manufacture the first TFT-LCD assembly substrate in the liquid crystal display according to the third embodiment of the present invention.

A sixth example of the method of manufacturing the TFT-LCD assembly substrate according to the embodiments of the present invention may comprise the following steps:

Step 61, forming a color filter structure layer comprising a color filter pattern, a first black matrix and a second black matrix on a substrate;

Step 62, depositing a gate metal thin film on the substrate after step 61 and forming gate lines by a patterning process;

Step 63, depositing a gate insulating layer, a semiconductor thin film, a doped semiconductor thin film and a source/drain metal thin film on the substrate after the step 62, and forming data lines and an active layer, a source electrode, a drain electrode and a TFT channel region of each TFT by a patterning process, wherein a combination pixel region defined by one gate line and one data line comprises two juxtaposed pixel regions;

Step 64, depositing a passivation layer on the substrate after step 63, and forming passivation layer via holes by a patterning process, each of which is positioned above the drain electrode of each TFT;

Step 65, depositing a transparent conductive film on the substrate after step 64, and forming a pixel electrode and a common electrode for each combination pixel region by a patterning process, wherein the pixel electrode is positioned in one pixel region and connected with the drain electrode through the passivation layer via hole, and wherein the common electrode is positioned in the other pixel region and the common electrodes in the same column or the same row are connected to each other.

The present example is a modification of the previous third example and fourth example and may be adopted to manufacture the second TFT-LCD assembly substrate in the liquid crystal display according to the third embodiment of the present invention.

The liquid crystal display of the embodiments of the present invention may be manufactured by the following manufacturing method. The method may comprise:

Step 100, manufacturing a first TFT-LCD assembly substrate and a second TFT-LCD assembly substrate, wherein the first TFT-LCD assembly substrate comprises first gate lines and data lines formed on a first substrate and defined combination pixel regions, wherein one combination pixel region comprises two pixel regions, and in one pixel region are formed a first thin film transistor and a first pixel electrode and in the other pixel region is formed a first common electrode; the second TFT-LCD assembly substrate comprises a color filter structure layer and an array structure layer, wherein the array structure layer comprises second gate lines and second data lines formed on a second substrate and defined combination pixel regions, and the combination pixel region comprises two pixel regions, and in one pixel region is formed a second common electrode and in the other pixel region are formed a second thin film transistor and a second pixel electrode;

Step 201, assembling the first TFT-LCD assembly substrate and the second TFT-LCD assembly substrate together, wherein the first gate lines and the second gate lines, the first data lines and the second data lines, the first pixel electrodes and the second common electrodes, the first common electrodes and the second pixel electrodes are respectively disposed opposite to each other.

Embodiments of the present invention provide a method for manufacturing the liquid crystal display, in which the liquid crystal display is formed by assembling two TFT-LCD assembly substrates each formed with both the array structure pattern and the common electrode pattern, and the array structure patterns on the two TFT-LCD assembly substrates are not opposite to each other after the assembling process, and the array structure pattern on one TFT-LCD assembly substrate corresponds to the common electrode pattern on the other TFT-LCD assembly substrate, and thus, the aperture ratio of the liquid crystal display can be effectively improved. The liquid crystal display according to the embodiments of the present invention may be manufactured by employing respective example of the method of manufacturing the TFT-LCD assembly substrate according to the embodiments of the present invention.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A thin film transistor liquid crystal display (TFT-LCD) assembly substrate, comprising:
   an array structure layer, comprising:
      a plurality of first signal lines; and
      a plurality of second signal lines,
      wherein adjacent first signal lines and adjacent second signal lines cross each other to define a plurality of combination pixel regions, and each of the combination pixel regions comprises two pixel regions juxtaposed along a direction of the first signal line, there are a thin film transistor and a pixel electrode that is connected to the thin film transistor formed in one pixel region of the two pixel regions and there is a common electrode formed in the other pixel region, and the pixel electrode formed in the one pixel region and the common electrode in the other pixel region are separated from each other by a gap in the plane of the assembly substrate and configured to work separately from each other.

2. The TFT-LCD assembly substrate as claimed in claim 1, wherein the common electrodes adjacent to each other in a direction of the second signal line are connected with each other.

3. The TFT-LCD assembly substrate as claimed in claim 1, further comprising shield lines each disposed between two adjacent second signal lines,
   wherein the two pixel regions of each combination pixel region are spaced apart by one shield line.

4. The TFT-LCD assembly substrate as claimed in claim 3, wherein the shield lines partially overlap the pixel electrode in each combination pixel region.

5. The TFT-LCD assembly substrate as claimed in claim 1, further comprising a black matrix, which is disposed to correspond to the gap between the two pixel regions of each combination pixel region.

6. The TFT-LCD assembly substrate as claimed in claim 1, further comprising a color filter structure layer,
   wherein the color filter structure layer is formed above or below the array structure layer.

7. The TFT-LCD assembly substrate as claimed in claim 6, wherein the color filter structure layer comprises a plurality of color filter units each corresponding to one pixel region of each combination pixel region.

8. The TFT-LCD assembly substrate as claimed in claim 1, wherein the pixel electrode formed in the one pixel region and the common electrode in the other pixel region are on a same level of the assembly substrate.

9. A thin film transistor liquid crystal display (TFT-LCD) assembly substrate, comprising:
   an array structure layer, comprising:
      a plurality of first signal lines; and
      a plurality of second signal lines,
      wherein adjacent first signal lines and adjacent second signal lines cross each other to define a plurality of combination pixel regions, and each of the combination pixel regions comprises a pixel electrode region and a common electrode region which are juxtaposed along a direction of the first signal line, the pixel electrode region and a common electrode region are separated from each other by a shield line or a black matrix therebetween, the pixel electrode region comprises a thin film transistor and a pixel electrode that is connected to the thin film transistor formed, and the common electrode region comprises a common electrode, and the pixel electrode and the common electrode are separated from each other by a gap in the plane of the assembly substrate and do not extend into the common electrode region and the pixel electrode region respectively.

10. The TFT-LCD assembly substrate as claimed in claim 9, wherein the common electrodes adjacent to each other in a direction of the second signal line are connected with each other.

11. The TFT-LCD assembly substrate as claimed in claim 9, wherein the shield line and the black matrix partially overlaps the pixel electrode in each combination pixel region.

12. The TFT-LCD assembly substrate as claimed in claim 9, further comprising a color filter structure layer, wherein the color filter structure layer is formed above or below the array structure layer.

13. The TFT-LCD assembly substrate as claimed in claim 12, wherein the color filter structure layer comprises a plurality of color filter units each corresponding to the pixel electrode region or the common electrode region of each combination pixel region.

14. The TFT-LCD assembly substrate as claimed in claim 9, wherein the pixel electrode formed and the common electrode are on a same level of the assembly substrate.

15. A thin film transistor liquid crystal display (TFT-LCD) assembly substrate, comprising:
   an array structure layer, comprising:
      a plurality of first signal lines extending along a first direction;
      a plurality of second signal lines extending along a second direction; and
      a plurality of columns of pixel regions extending along the second direction;
      wherein two columns of pixel regions that are juxtaposed adjacent to each other are configured between two adjacent second signal lines, each pixel region of one of the two columns of pixel regions comprises a thin film transistor and a pixel electrode that is connected to the thin film transistor, each pixel region of the other of the two columns of pixel regions comprises a common electrode, the pixel electrode and the common electrode respectively in two pixel regions that are adjacent to each other along the first direction are separated from each other by a gap in the plane of the assembly substrate and configured to belong to display regions controlled separately from each other.

16. The TFT-LCD assembly substrate as claimed in claim 15, wherein the common electrodes in a same column of pixel regions are connected with each other along the second direction.

17. The TFT-LCD assembly substrate as claimed in claim 15, further comprising shield lines each extending along the second direction and disposed between two adjacent second signal lines,
   wherein the two columns of pixel regions between the two adjacent second signal lines are spaced apart by one shield line between the two adjacent second signal lines.

18. The TFT-LCD assembly substrate as claimed in claim 15, further comprising a black matrix, which is disposed to correspond to the gap between the two columns of pixel regions.

19. The TFT-LCD assembly substrate as claimed in claim 15, further comprising a color filter structure layer,
   wherein the color filter structure layer is formed above or below the array structure layer.

20. The TFT-LCD assembly substrate as claimed in claim 19, wherein the color filter structure layer comprises a plurality of color filter units each corresponding to one pixel region of the columns of pixel regions.

* * * * *